United States Patent
Campbell et al.

(10) Patent No.: US 10,962,566 B1
(45) Date of Patent: Mar. 30, 2021

(54) POSITION SENSING IN A PROBE TO MODIFY TRANSFER CHARACTERISTICS IN A SYSTEM

(71) Applicant: Tektronix, Inc., Beaverton, OR (US)

(72) Inventors: Julie A. Campbell, Beaverton, OR (US); Josiah A. Bartlett, Forest Grove, OR (US); David A. Sailor, Boring, OR (US); Jay Schwichtenberg, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 115 days.

(21) Appl. No.: 16/241,523

(22) Filed: Jan. 7, 2019

Related U.S. Application Data

(62) Division of application No. 14/923,242, filed on Oct. 26, 2015, now Pat. No. 10,215,776.

(51) Int. Cl.
*G01R 1/067* (2006.01)
*G01R 1/073* (2006.01)
*G01R 35/00* (2006.01)

(52) U.S. Cl.
CPC ......... *G01R 1/06766* (2013.01); *G01R 1/073* (2013.01); *G01R 35/005* (2013.01)

(58) Field of Classification Search
None
See application file for complete search history.

(56) References Cited

U.S. PATENT DOCUMENTS

| | | | | |
|---|---|---|---|---|
| 7,161,344 B2* | 1/2007 | Kwark | ............... | G01R 1/06772 324/72.5 |
| 7,212,018 B2* | 5/2007 | Annichiari | ............. | G01R 1/067 324/755.01 |
| 7,268,614 B2* | 9/2007 | Jung | ....................... | G05F 3/205 327/543 |
| 10,215,776 B2* | 2/2019 | Campbell | ............ | G01R 35/005 |
| 2003/0217478 A1* | 11/2003 | Matsumiya | ........ | G01D 5/34707 33/784 |

\* cited by examiner

*Primary Examiner* — Paresh Patel
(74) *Attorney, Agent, or Firm* — Miller Nash Graham & Dunn; Andrew J. Harrington

(57) ABSTRACT

Test and measurement probes include a body, an adjustable member moveably coupled to the body and having a changeable position relative to the body, and a transducer subsystem structured to measure the position of the adjustable member and configured to output a position signal indicative of the position of the adjustable member. A change in the position of the adjustable member causes a change in an electrical characteristic of the probe. A position-dependent correction factor may be used to correct the change in the electrical characteristic. Methods of compensating for a change in a response of a test and measurement system include monitoring a position sensor output to detect a position change of a first part of a probe relative to a second part, determining that the position sensor output value has crossed a boundary value between a first and second range, and applying a compensation factor corresponding to the second range to modify the response of the system.

8 Claims, 8 Drawing Sheets

POSITION SENSING IN A PROBE TO MODIFY TRANSFER CHARACTERISTICS IN A SYSTEM

CROSS-REFERENCE TO RELATED APPLICATIONS

This application is a divisional of U.S. patent application Ser. No. 14/923,242, filed Oct. 26, 2015, which is hereby incorporated by reference in its entirety.

TECHNICAL FIELD

This disclosure relates to test and measurement systems, and more particularly to probes in test and measurement systems.

BACKGROUND

Users of a test and measurement instrument, such as an oscilloscope, often use a probe to connect a device-under-test (DUT), such as a circuit board, to an input of the test and measurement instrument in order to visualize, debug, and perform measurements of electrical signals occurring in the DUT. To measure an electrical signal in a DUT, a user typically needs to establish physical contact between the probe and one or more test points of interest in the DUT. Test points may be located in various places on a DUT circuit board and may be traces or vias, connector pins, or component pads or pins, such as the pins of an integrated circuit (IC). Physically probing a DUT test point can be challenging, especially when the electrical components are very small, or when there are a large number of components packed into a small area. In these cases, the test points of interest can be difficult to access since they may be obscured by other components, cables, or mechanical features of the DUT.

Furthermore, the signals that a probe user needs to measure and debug often operate at high frequencies and low signal levels. For example, high-speed serial busses such as DDR2, DDR4, and PCI Gen 4, among others, are very prevalent in contemporary DUTs. These types of bus signals can have fast rise times, small voltage swings, and high pulse frequencies. Therefore, the test and measurement instruments and probes that are used to measure these types of signals must be high performance, precision devices capable of high bandwidth signal acquisition and good signal fidelity. In particular, the probe should have specified electrical characteristics and performance, and should maintain that specified performance in all use cases.

Sometimes the probe user may need to make physical contact simultaneously with more than one point in a DUT circuit. For example, when measuring a single-ended signal, the user may need to contact the probe to both a test point, as well as to a ground point in the DUT. Or, if measuring a differential signal, the user may need to contact the probe to two test points, where the differential signal is the difference in voltages at the two test points over time. Such pairs of test points may have various amounts of space between them. In order to accommodate variable test point spacing, many probes have adjustment features which allow the distance between the test point contacts on the probe to be changed as necessary. Adjusting these types of probes typically includes adjusting the position of a part of the probe in which the measured signal is conveyed. When a part of the probe in the signal path changes positions, this generally tends to change an electrical characteristic of the probe, potentially to the extent that the probe no longer performs within its specifications. This in turn can lead to an inaccurate measurement of the signal in the DUT. However, conventional adjustable probes are not able to compensate for such electrical characteristic changes to return the performance of the probe to within specification.

Embodiments of the invention addresses these and other limitations of the prior art.

SUMMARY OF THE DISCLOSURE

Test and measurement probes include a body, an adjustable member, and a transducer subsystem. The adjustable member is moveably coupled to the body and has a position relative to the body that is changeable. The transducer subsystem is structured to measure the position of the adjustable member and is configured to output a position signal indicative of the position of the adjustable member. A change in the position of the adjustable member causes a change in an electrical characteristic of the probe. In some embodiments, the probe also includes a processor configured to monitor the position signal from the transducer subsystem to determine the position of the adjustable member, and to initiate a correction of the changed electrical characteristic in response to the adjustable member entering a particular range of positions.

A test and measurement system includes an oscilloscope and a probe. The probe has at least two test point contacts with an adjustable distance therebetween. The system also includes a non-volatile memory and a tip spacing detector, both disposed in the probe, and a processor. The non-volatile memory stores a plurality of frequency response correction values. Each frequency response correction value is pre-calculated to correct for a non-ideality of a frequency response of the probe occurring when the distance between the probe's test point contacts is within a particular range. The tip spacing detector is adapted to detect the distance between two of the test point contacts and is configured to generate an output indicative of the detected distance. The processor is configured to monitor the output of the tip spacing detector to determine when the detected distance enters the particular range, to read the frequency response correction value associated with the particular range from the non-volatile memory, and to communicate the read frequency response correction value to the oscilloscope for use in modifying a frequency response of the system.

Methods of compensating for a change in a response of a test and measurement system, the system including an instrument and a probe, and the change in the response being caused by a movement of a first part of the probe, involve monitoring a position sensor output to detect a position change of the first part of a probe relative to a second part of the probe, determining that the position sensor output value has crossed a boundary value between a first range of position values and a second range of position values, and applying a compensation corresponding to the second range of position values to modify the response of the test and measurement system.

Methods of calibrating a probe having a non-volatile memory and a position sensor that is adapted to measure the position of an adjustable first part of the probe relative to a second part of the probe include: (a) logically dividing the full range of motion of the first part of the probe into a plurality of zones; (b) adjusting the position of the first part of the probe to a known position representing a boundary of one of the zones, (c) writing, to the non-volatile memory, the position sensor output value corresponding to the known position; (d) applying a known stimulus signal to the probe input and measuring a resulting response of the probe; (e) calculating one or more compensation factors sufficient to correct a portion of the resulting response of the probe that does not meet a response specification of the probe; (f) writing, to the non-volatile memory, the calculated one or more compensation factors corresponding to the one of the zones, and (g) repeating (b)—(f) for each of the remaining plurality of zones.

DETAILED DESCRIPTION

Figure 1:
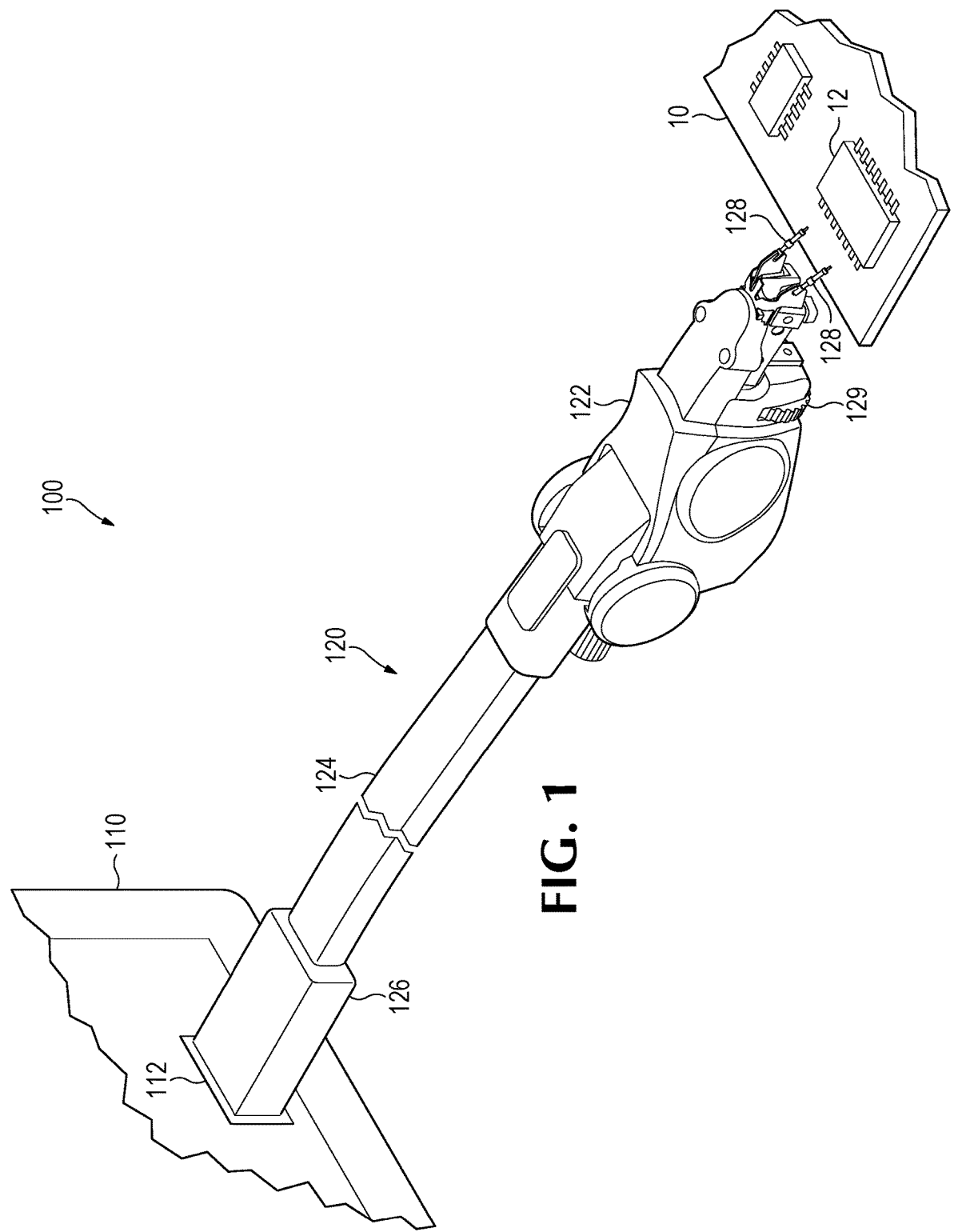
FIG. 1 is a perspective view of a typical test and measurement system including a test and measurement instrument and a test and measurement probe, according to some embodiments of the invention.

FIG. 1 depicts an example test and measurement system 100. The test and measurement system 100 includes a test and measurement instrument 110, such as an oscilloscope, as well as a test and measurement probe 120. The test and measurement probe 120 connects to an input 112 of the test and measurement instrument 110. The probe 120 may be used to make electrical contact with one or more test points in a user's device-under-test (DUT) 10, which may be a circuit board. For example, the probe 120 may be positioned by a user to make physical contact with one or more pins on an integrated circuit (IC) 12 placed on the circuit board 10, in order to monitor the electrical signal present at those points in the DUT 10, that is, the "measured signal."

The probe 120 generally includes a probe head 122, a probe-to-instrument interface 126, and one or more conductors 124 between the probe head 122 and the probe-to-instrument interface 126. As a browser probe, the probe head 122 is generally dimensioned to be as small as possible for maximum accessibility to test points, but also large enough that it can be comfortably held in a user's grasp. The probe head 122 may alternatively be held by a fixture or a holding tool. The conductors 124 are typically designed as a relatively long cable, for example, a high-precision coaxial cable, since flexibility of the connection between the instrument 110 and the DUT 10 is typically desirable. However, the conductors 124 may alternatively be designed as a flexible circuit, a rigid circuit board, or another form of interconnect that is suitable for conveying power, control, and data signals between the probe head 122 and the probe-to-instrument interface 126. The probe-to-instrument interface 126 includes a connector that is suitable for connecting to the input 112 of the test and measurement instrument 110, and may also include additional circuitry to provide, for example, signal conditioning, probe control, or probe memory.

According to some embodiments, such as the embodiment illustrated in FIG. 1, the probe 120 is a differential probe. As a differential probe, the probe 120 includes at least two test point contacts 128 in order to make electrical contact with two DUT test points. Typically, the two test point contacts 128 are used to probe pairs of traces, vias, component pins or pads, or connector contacts on the DUT 10. Each pair of DUT test points may have a different amount of space between the two test points, ranging from a spacing of nearly zero inches apart up to approximately 0.200 inches or more apart. According to other embodiments, the probe 120 is a single-ended probe. In single-ended embodiments, one test point contact 128 makes electrical contact with a DUT test point, and another test point contact 128 makes electrical contact with a DUT ground point. However, even in single-ended embodiments, the test point and the ground point may have various amounts of space between them. To accommodate these spacing variations, the probe 120 includes an adjustment mechanism 129 to allow adjustment of the spacing between the test point contacts 128.

Generally, if a test and measurement probe includes a part that is moveable with respect to other stationary parts of the probe, when the moveable part changes position, the electrical characteristics and performance of the probe can be affected. This is especially true when the moveable part of the probe carries or contains a portion of the measured signal path. For example, in the probe 120 illustrated in FIG. 1, the two moveable test point contacts 128 each include a portion of the measured signal path; that is, the test point contacts 128 each provide a portion of the electrical signal path from the DUT 10 test point to the input 112 of the test and measurement instrument 110. When the two test point contacts 128 change positions relative to the probe head 122—for example, by being adjusted to increase or decrease the inter-contact spacing—electrical characteristics of the probe 120, such as the electrical loop length and the parasitic electrical field environment, also change. These electrical characteristic changes can affect the performance and response of the probe 120 by altering either a transfer characteristic of the probe, an impedance characteristic of the probe, or both. For example, moving the two test point contacts 128 to change the inter-contact spacing will usually affect a transfer characteristic such as the frequency response of the probe 120. Such a frequency response change is undesirable because, in order to properly measure signals in the DUT 10, a user relies on the probe 120—and, indeed, the entire test and measurement system 100—having a specified, known frequency response.

Embodiments of the invention address this problem by generally providing a test and measurement system including a probe that is capable of sensing the position of an adjustable part of the probe. Further, embodiments of the invention include processes for characterizing the performance of such a probe with the adjustable part set to various positions within the adjustment range of the adjustable part and storing characterization factors associated with each position. And further, embodiments of the invention include processes for sensing the position of the adjustable part of the probe, recalling the stored characterization factors associated with that sensed position, and applying those recalled factors to the overall test and measurement system in order to maintain the specified electrical characteristics, response, and performance of the probe.

Figure 2:
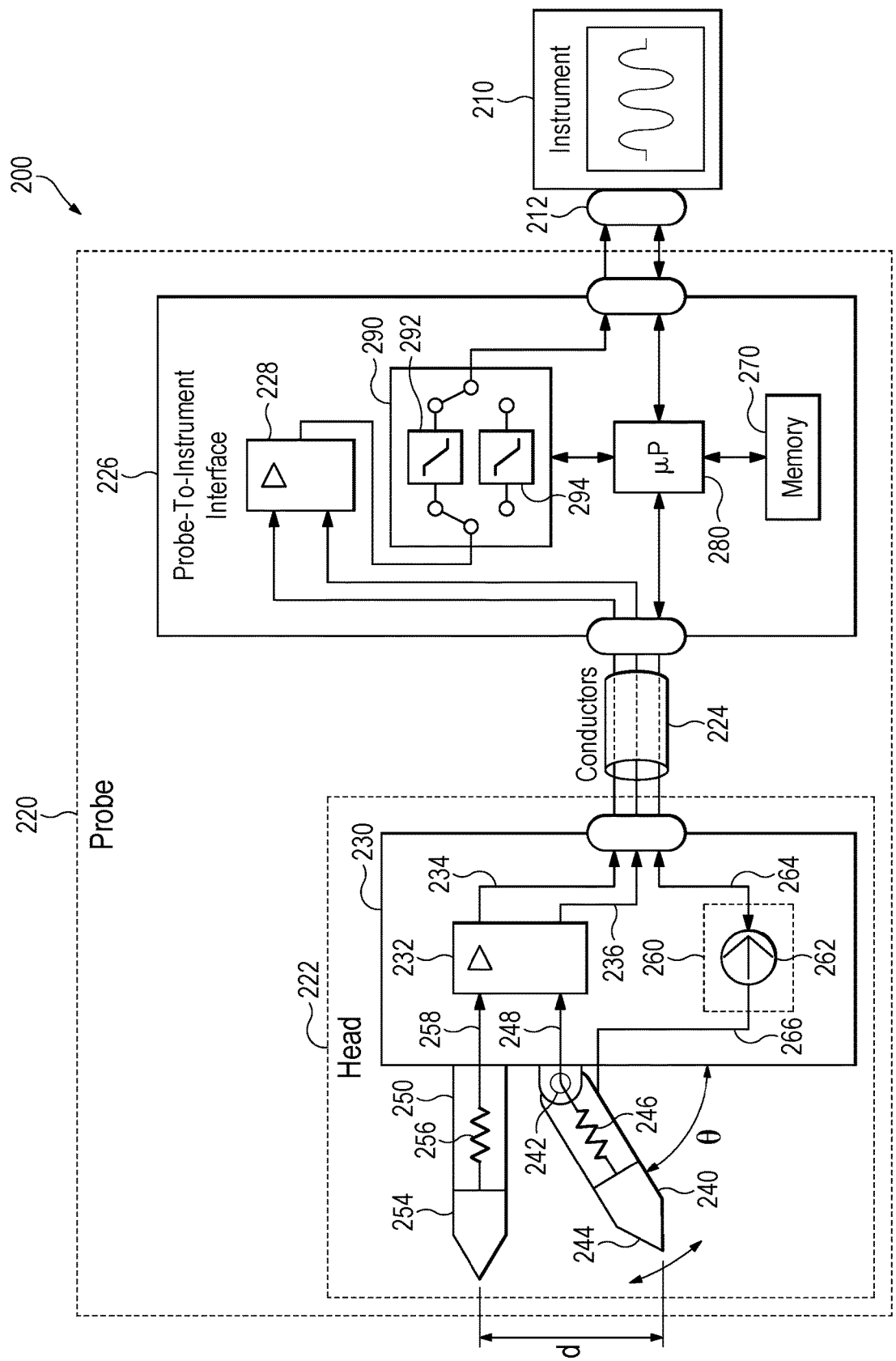
FIG. 2 is a simplified block diagram of a test and measurement system, according to some embodiments of the invention.

FIG. 2 is a simplified block diagram of a test and measurement system 200 according to embodiments of the invention. The test and measurement system 200 includes a test and measurement instrument 210, which may be, for example, an oscilloscope, and a test and measurement probe 220. The probe 220 includes a probe head 222, one or more conductors 224, and a probe-to-instrument interface 226.

The probe head 222 includes a body 230, which is generally designed to be held in a user's hand so that the user can position the probe head 222 to make electrical contact with a test point in a DUT. The probe head 222 also includes an adjustable member 240. The adjustable member 240 is moveably coupled to the body 230 so that the position of the adjustable member 240 relative to the body 230 is changeable. For example, in some embodiments, the adjustable member 240 may be moveably coupled to the body 230 directly, at a hinge point 242, so that an angle θ between the adjustable member 240 and the body 230 is changeable. In other embodiments, the adjustable member 240 may be moveably coupled to the body 230 indirectly, by other mechanical components. The position of the adjustable member 240 relative to the body 230 may be changed directly by a user, such as by a user pivoting the adjustable member 240 about the hinge point 242. Or, the position of the adjustable member 240 may be changed indirectly, such as by operation of a position adjustment mechanism (not shown).

In some embodiments, the adjustable member 240 includes a test point contact for making electrical contact with a test point in a DUT. For example, the adjustable member 240 illustrated in FIG. 2 includes a test point contact 244, such as a pogo pin, situated at the end of the adjustable member 240, a resistor 246, connected to the test point contact 244, and a conductive trace 248 that provides an electrical path for the measured signal from a DUT test point into the body 230 of the probe head 222 through the hinge point 242. The adjustable member 240 thereby includes at least a portion of the measured signal path of the probe 220.

In some embodiments, the probe head 222 may include a second member 250, which may include a second test point contact 254 for making electrical contact with a second DUT test point or a DUT ground point, a second resistor 256, and a second conductive trace 258. The second member 250 may have a fixed position relative to the body 230, as illustrated in FIG. 2, or the second member 250 may, like the adjustable member 240, have a position relative to the body that is changeable. The probe head 222 may include additional fixed or adjustable members.

The probe head 222 may house other components in the body, such as an amplifier 232 for amplifying the measured signal from the DUT test point. In some embodiments, as illustrated in FIG. 2, the amplifier 232 accepts the pair of conductive traces 248, 258 as inputs, and outputs to a pair of conductive traces 234, 236. The signals on the traces 234, 236 are then routed through the conductors 224, and become inputs to a differential amplifier 228 located in the probe-to-instrument interface 226. The differential signal output of the amplifier 228 is then conveyed to the instrument 210 through an input connector 212.

The probe head 222 also includes a transducer subsystem 260, which is based on a transducer 262. As used in this disclosure, a "transducer" is any device that converts variations in a physical quantity into an electrical signal. The transducer subsystem 260 is structured to measure the position of the adjustable member 240, and is configured to output a position signal 264 indicative of the position of the adjustable member 240. The particular structure needed to allow the transducer subsystem 260 to measure the position of the adjustable member 240 necessarily depends on the type of the transducer 262, as well as the structure of the adjustable member 240, and the particular way in which the adjustable member 240 is moveably coupled to the body 230. In FIG. 2, the structure adapting the transducer subsystem 260 to the adjustable member 240 is represented by reference number 266. For several types of transducers, the particular adaptation 266 may be a mechanical link between the adjustable member 240 and the transducer 262. For example, in some embodiments, the transducer subsystem 260 includes a rotary encoder as the transducer 262. In these embodiments, the rotary encoder 262 is adapted to measure the position of the adjustable member 240 by being mounted directly on the hinge point 242 in order to measure a change in the angle θ between the adjustable member 240 and the body 230. In some embodiments, the rotary encoder 262 may be an angle sensor that measures the angle θ between the adjustable member 240 and the body 230.

In other embodiments, the transducer subsystem 260 includes a linear encoder as the transducer 262. In these embodiments, the linear encoder 262 may be adapted to measure the position of the adjustable member 240 by, for example, having one end connected to the body 230 and having the other end connected to the adjustable member 240 at a point between the hinge point 242 and the test point contact 244. With this structure, the linear encoder 262 shaft 266 expands when the angle θ increases, and contracts when the angle θ decreases. The position signal 264 output by the linear encoder 262 can then be used to calculate the position of the adjustable member 240.

In some cases, design requirements for the probe 220, and especially for the probe head 222, may dictate an adjustable member 240 that is either very small, or flexible, or both, such that a direct connection of the transducer 262 to the adjustable member 240 is impracticable or impossible. In these cases, the transducer subsystem 260 may be adapted to measure the position of the adjustable member 240 through an indirect connection 266 to the adjustable member 240.

Figure 3:
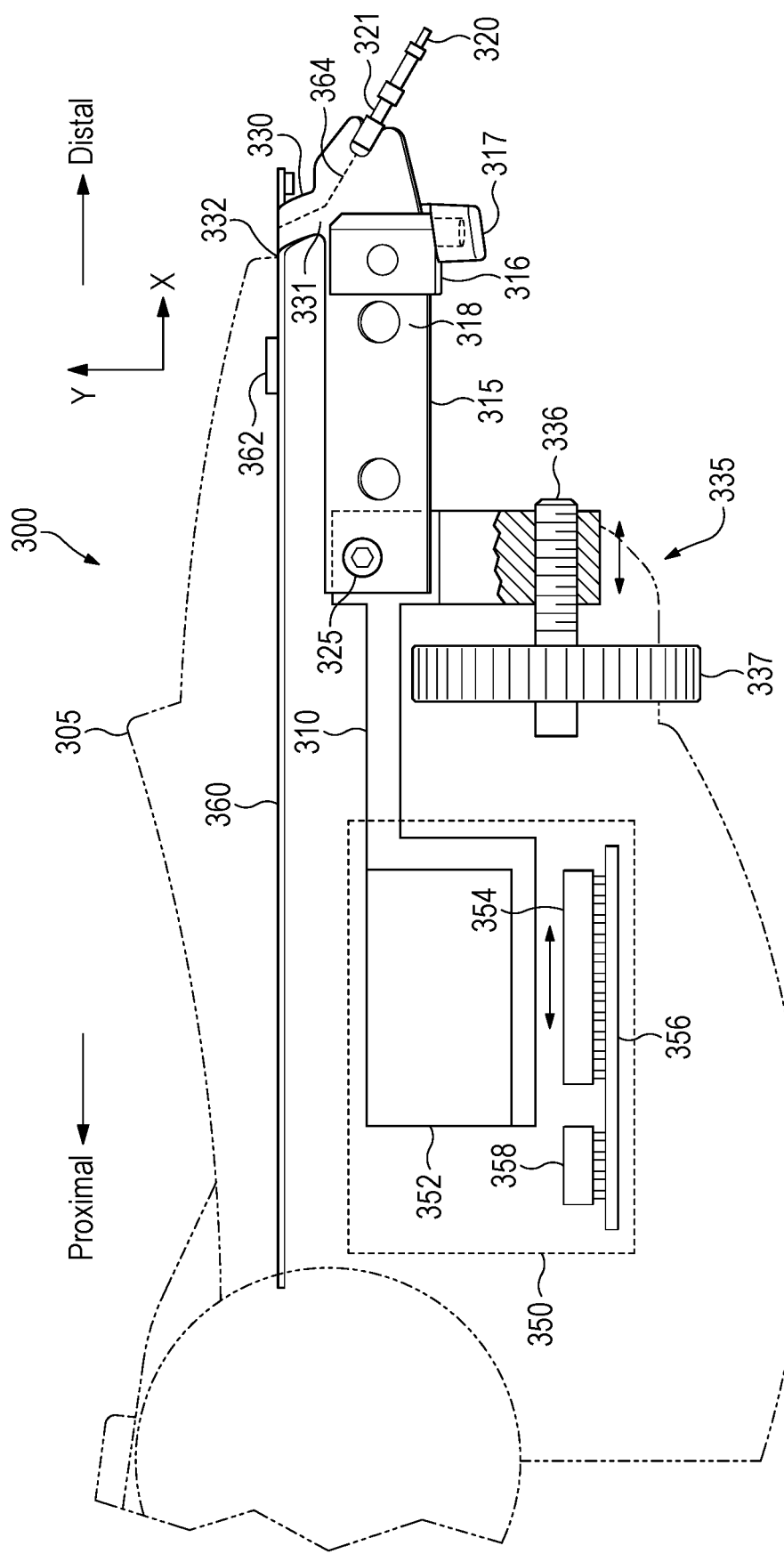
FIG. 3 is a side elevation view of a probe head, according to some embodiments of the invention.

FIG. 3 is a side view of a probe head 300 according to particular, preferred embodiments of the invention, which illustrate an example of such an indirect connection. The probe head 300 includes a body 305 that is dimensioned to be as small as possible, in order to provide good visibility of the DUT to a user, yet still large enough to be comfortably held by the user. Portions of the body 305 are drawn with phantom lines in FIG. 3 so as to more clearly illustrate some internal components of the probe head 300.

The probe head 300 includes an adjustable member in the form of a flexible arm 315. The flexible arm 315 has a test point contact 320 at its distal end for making electrical contact with a test point in a DUT. A user will position the probe head 300 so that the test point contact 320 touches a test point of interest in a DUT. In some embodiments, the test point contact 320 comprises a pogo pin. The flexible arm 315 may also have a resistor 321 placed in series with the test point contact 320. In some preferred embodiments, the probe head 300 includes a second, symmetric flexible arm 315. Like the first flexible arm 315, the second flexible arm 315 also has a test point contact 320 disposed at its distal end for making electrical contact with a second test point in a DUT, and may also have a resistor 321 placed in series with the test point contact 320.

The pair of flexible arms 315 are each attached at their proximal ends to a position adjuster 310. The flexible arm 315 can be attached to the position adjuster 310 by a fastener, such as, for example, a screw 325, or by another suitable attachment method, such as a rivet or an adhesive. The position adjuster 310 is structured to be able to move linearly with respect to the body 305. For example, the position adjuster 310 depicted in FIG. 3 is able to slide forward and backward along the x-axis in relation to the body 305. In some embodiments, the position adjuster 310 travels within a channel formed within the body 305, the channel being formed to constrain the movement of the position adjuster 310 to a line along the x-axis, as illustrated in FIG. 3. When the position adjuster 310 moves forward along the x-axis, the proximal ends of the flexible arms 315 also move forward along the x-axis, and when the position adjuster 310 moves backward along the x-axis, the proximal ends of the flexible arms 315 also move backward along the x-axis.

However, this forward and backward motion of the flexible arms 315 is constrained by a flexible linkage 330. The flexible linkage 330 connects to the flexible arms 315 at an intermediate point 331 between the proximal end and the distal end of each flexible arm 315. The flexible linkage 330 is also centrally fixed at a point 332 to the body 305. With this structure, the flexible linkage 330 forms a three bar mechanical linkage with each flexible arm 315: one bar being the flexible linkage 330, the second bar being a first portion of the flexible arm 315, and the third bar being a second portion of the flexible arm 315. The flexible linkage 330 acts to keep the distance between the point 331 and the point 332 substantially constant. Therefore, when the position adjuster 310 and the attached proximal ends of the flexible arms 315 move forward along the x-axis, having the distance between the points 331, 332 constrained by the flexible linkage 330 causes the flexible arm 315 to buckle and bend at one or more locations. When the flexible arms 315 bend, they each exert a torsional force on the flexible linkage 330 causing the flexible linkage 330 to twist slightly. Conversely, when the position adjuster 310 moves backwards along the x-axis, the flexible arms 315 are each caused to unbend back towards a substantially straightened orientations.

In some preferred embodiments, in order to more precisely control the portion of the flexible arms 315 in which this bending occurs, and in order to enhance the repeatability of the bending motion, a stiffener 316 is attached to a portion of each flexible arm 315. The stiffener 316 may be attached to one side of the flexible arm 315, or it may sandwich a portion of the flexible arm 315. To further control the bending motion of the flexible arms 315, and to prevent vertical motion of the flexible arms 315 along the y-axis, the stiffener 316 may optionally be designed to pivot within a support plate 317, which is attached to the body 305. The stiffener 316 thereby acts to constrain the bending of the flexible arms 315 to occur within a particular portion 318 of each flexible arm 315. That is, the stiffener 316 defines an articulation region 318, or hinge region, on each flexible arm 315.

To move the position adjuster 310 along its linear path of travel, a user operates a linear actuator 335. The linear actuator 335 pushes or pulls on the position adjuster 310 to correspondingly move the position adjuster 310 forward or backward in relation to the body 305. The linear actuator 335 may comprise a threaded rod 336 that engages with a threaded hole in the rigid member 310, and a thumbwheel 337 that is connected to the threaded rod 336. A user turns the thumbwheel 337 in one direction to cause the position adjuster 310 to move forward along the x-axis, thereby bending the flexible arms 315 and causing the distance between the test point contacts 320 to decrease, and turns the thumbwheel 337 in the other direction to cause the position adjuster 310 to move backward along the x-axis, thereby unbending the flexible arms 315 and causing the distance between the test point contacts 320 to increase.

Figure 4A:
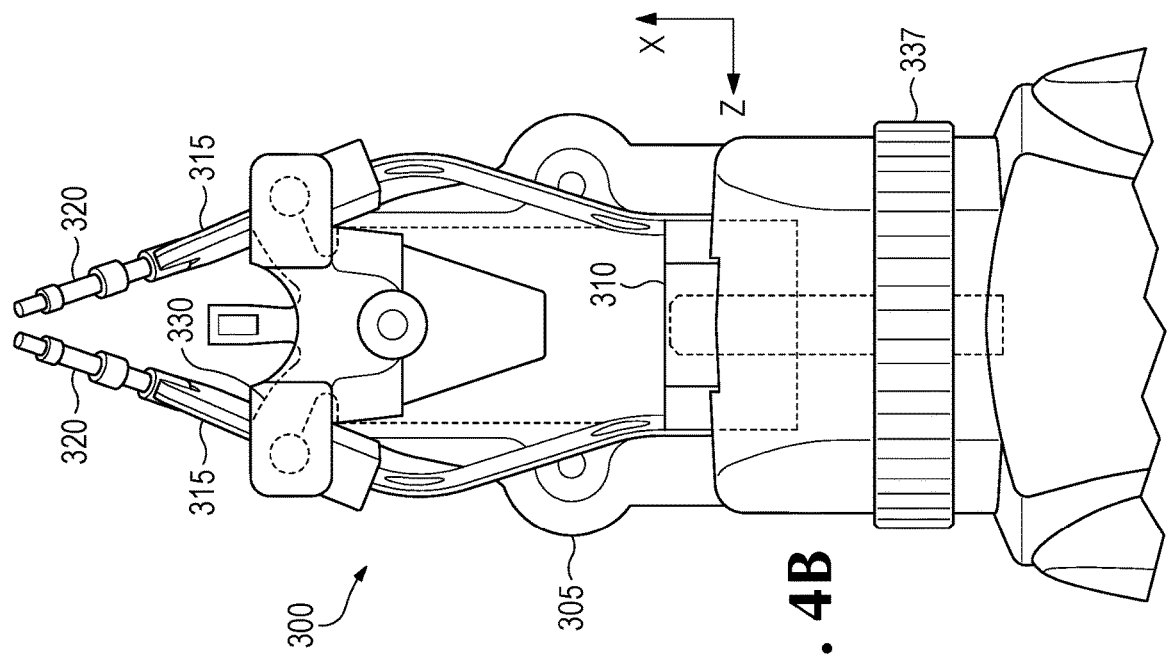
FIGS. 4A and 4B are bottom plan views of the probe head of FIG. 3, according to some embodiments of the invention.
Figure 4B:
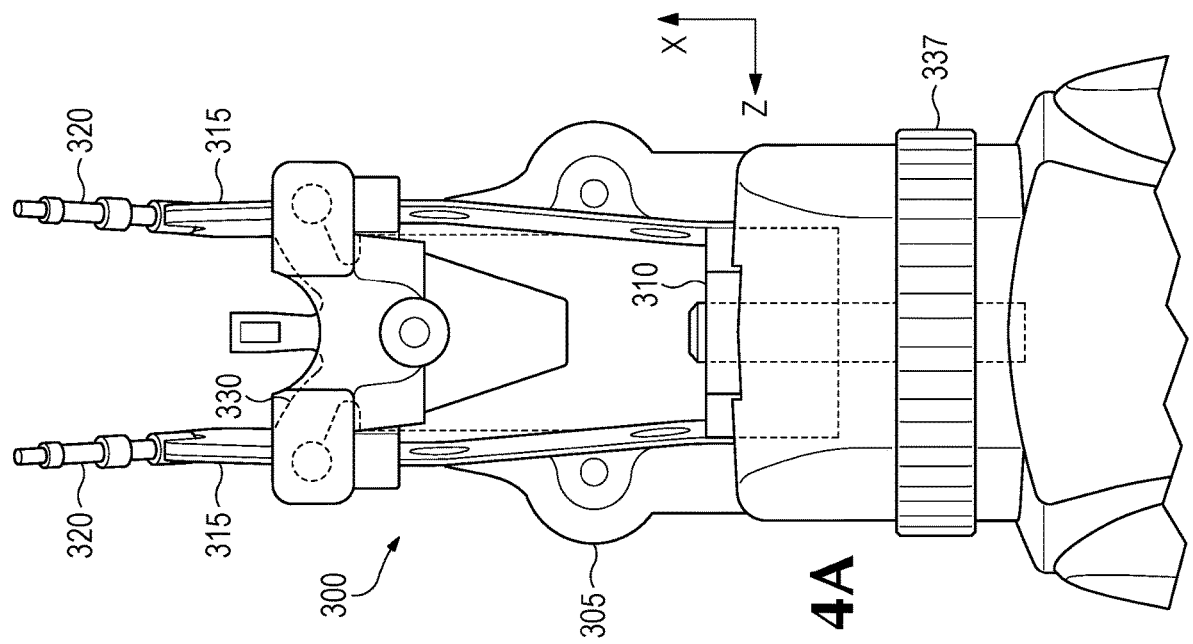

The pincher-like motion of the pair of flexible arms 315 can be further illustrated by referring to FIGS. 4A and 4B, which are bottom views of the probe head 300 according to embodiments of the invention. FIG. 4A depicts the probe head 300 with the flexible arms 315 in a substantially open position and the test point contacts 320 at their maximum spacing. As shown in FIG. 4A, when the flexible arms 315 are in the substantially open position, the position adjuster 310 is in its most-rearward position towards the thumbwheel 337, and the flexible arms 315 are substantially straightened, that is, the flexible arms 315 are substantially parallel to the x-axis. In this position, the test point contacts 320 are spaced to mate with DUT test points that are approximately 0.200 inches apart.

For comparison, FIG. 4B depicts the probe head 300 with the flexible arms 315 in a substantially closed position and the test point contacts 320 at their minimum spacing. As shown in FIG. 4B, when the flexible arms 315 are in the substantially closed position, the position adjuster 310 is in its most-forward position, furthest from the thumbwheel 337, and each of the flexible arms 315 is bent toward the other flexible arm 315. In this position, the test point contacts 320 are spaced to mate with DUT test point contacts that are approximately 0.010 inches apart, although in some embodiments this minimum inter-contact spacing may be even smaller.

Referring back to FIG. 3, the probe head 300 includes a transducer subsystem 350 that is structured to measure the position of the pair of flexible arms 315. Specifically, the transducer subsystem 350 is structured to measure the distance between the pair of test point contacts 320 by being coupled to the pair of flexible arms 315 indirectly, through the position adjuster 310. The transducer subsystem 350 includes a magnet 352 and a hall effect sensor 354. The position adjuster 310 has an elongated piece extending back into the body 305 to which the magnet 352 is attached. The hall effect sensor 354 is mounted inside the body 305, fixed in position relative to the body 305 at a location where the magnet 352 moves across the hall effect sensor 354, as illustrated in FIG. 3. The hall effect sensor 354 may be, for example, a model iC-MHL200 encoder manufactured by iC-Haus GmbH. The transducer subsystem 350 may also include a circuit 356, such as a small printed circuit board or flexible circuit, to which the hall effect sensor 354 may be attached. The circuit 356 may electrically connect to other parts of the probe head 300 using cables or other suitable connection means.

When the position adjuster 310 moves forward along the x-axis, causing the pair of test point contacts 320 to move closer together, the magnet 352 also moves forward across the surface of the stationary hall effect sensor 354. Conversely, when the position adjuster moves backward along the x-axis, causing the pair of test point contacts 320 to move apart, the magnet also moves backward across the surface of the hall effect sensor 354. These changes in the position of the magnet 352 are sensed by the hall effect sensor 354 which outputs a position signal that is used to determine the distance between the pair of test point contacts 320. The position signal is monitored by a processor 358.

The pair of flexible arms 315, and the flexible linkage 330 may be fabricated together as parts of a single flexible circuit 360. The flexible circuit 360 may include electrical components, such as an amplifier 362, and a conductive trace 364 on each flexible arm 315. Each conductive trace 364 provides an electrical path from the test point contact 320 to an input of the amplifier 362. Because the conductive trace 364 passes through a portion of the flexible linkage 330, when the pair of flexible arms 315 bend, thereby changing the distance between the test point contacts 320, the conductive trace 364 experiences the same slight torsion as the flexible linkage 330. Since the conductive trace 364 and the test point contact 320 are part of the measured signal path for the probe head 300, these changes in the position and orientation of the signal path alter an electrical characteristic, for example the frequency response, of the probe head 300.

In a conventional probe, a change in an electrical characteristic of the probe caused by a change in the physical position of an adjustable part of the probe is typically detrimental to the measurement accuracy of the probe. However, a probe according to an embodiment of the invention solves this problem by generally being able to detect the physical position of an adjustable part of the probe and by applying a position-dependent correction to maintain the specified electrical characteristics of the probe. For example, in the probe head 300, when the processor 358 detects, by monitoring the output position signal of the hall effect sensor 354, that the pair of flexible arms 315 have moved to a particular position which is known to cause a particular change in a particular electrical characteristic of the probe head 300, the processor 358 will cause a correction to be applied to counter the changed characteristic.

More generally, referring back to FIG. 2, in some embodiments, the probe 220 includes a microcontroller or processor 280. The processor 280 may be located in the probe-to-instrument interface 226. The processor 280 is configured to monitor the position signal 264 from the transducer subsystem 260. The probe 220 is generally calibrated at the factory to determine what particular electrical characteristic changes occur when the adjustable member 240 is moved into a particular range of positions. In other words, a particular range of positions of the adjustable member 240 will be known to cause particular electrical characteristic changes, and the correction necessary to compensate for those changed characteristics will also be known. Accordingly, when the processor 280 detects that the position of the adjustable member 240 is within a particular range, the processor 280 initiates a correction of the changed electrical characteristic corresponding to that particular range of positions. In some embodiments, the changed electrical characteristic is an impedance characteristic of the probe 220; that is, a characteristic of how the probe 220 electrically loads the DUT. In other embodiments, the changed electrical characteristic is a transfer characteristic of the probe 220, such as a step response or a frequency response.

In some embodiments, the processor 280 initiates the correction of the changed electrical characteristic in hardware. For example, in some embodiments, the probe 220 includes multiple selectable signal paths 290. Each selectable signal path may include an analog filter 292, 294. Each analog filter 292, 294 is suitable for correcting the change of the electrical characteristic that occurs when the adjustable member 240 is within each particular range of positions, respectively. When the processor 280 detects that the adjustable member 240 is within a first particular range of positions, which causes a first particular change in an electrical characteristic of the probe 220, the processor 280 initiates a correction of that change by selecting the first selectable signal path including the first analog filter 292, which is suitable for correcting that change. Likewise, when the processor 280 detects that the adjustable member 240 is within a second particular range of positions, which causes a second particular change in an electrical characteristic of the probe 220, the processor 280 initiates a correction of that change by selecting the second selectable signal path including the second analog filter 292, which is suitable for correcting that change.

In other embodiments, the processor 280 initiates the correction of the changed electrical characteristic in software or firmware, such as by applying mathematical operations to counteract the effect of the changed electrical characteristic on the measured signal. For example, as noted above, the changed electrical characteristic may be a transfer characteristic of the probe 220, such as a frequency response. In some embodiments, the probe 220 includes a memory 270. The memory 270 stores one or more transfer characteristic correction factors. Each stored correction factor corresponds to a particular range of positions of the adjustable member 240 such that, when the position of the adjustable member 240 is within the particular range, the corresponding correction factor saved in the memory 270 may be used to correct the changed transfer characteristic of the probe 220. When the processor 280 detects that the adjustable member 240 is within a particular range of positions, the processor 280 reads the correction factor corresponding to that particular range of positions from the memory 270, and communicates that correction factor to the test and measurement instrument 210. Software in the test and measurement instrument 210 then applies the correction factor to correct the performance of the probe 220, or of the entire system 200.

Since the changed electrical characteristic may be either an impedance characteristic, or a transfer characteristic, or both, and may be observable in either the time domain or the frequency domain, the correction factor that is applied to correct for the changed characteristic may be expressed in a number of different possible formats, depending on the actual type of the changed characteristic and which particular representation is computationally efficient. A correction factor may be represented in the format of a transfer function, an impulse response, a step response, a scattering parameter, a Y parameter, a Z parameter, or a T parameter, to name a few.

Although the changed electrical characteristic may be an impedance characteristic, a transfer characteristic, or both, the following paragraphs of this disclosure will discuss examples in which the changed electrical characteristic is a transfer characteristic, specifically, a frequency response. A change in a frequency response of the probe 220 caused by a change in the position of the adjustable member 240 is common to many embodiments of the invention. However, the following examples and explanations related to a changed frequency response are presented merely to simplify this disclosure, and are not intended to limit the scope of the invention. The principles of operation of the invention are similar regardless of whether or not the changed electrical characteristic is a frequency response.

All changes in the position of the adjustable member 240 will have some effect on the actual frequency response of the probe 220, however, a change must be of sufficient magnitude for it to cause the actual frequency response of the probe 220 to go "out-of-spec," that is, to cause the frequency response of the probe 220 to change to the extent that the actual frequency response no longer meets the typical, published, or guaranteed design specification for frequency response, as determined by the manufacturer of the probe 220. In other words, some small changes in the position of the adjustable member 240 may not require changing the correction factor that is being used. To conserve processing and memory resources, it is beneficial to select the minimum number of position ranges and corresponding correction factors necessary to maintain the specified frequency response of the probe 220 at all possible positions of the adjustable member 240. For example, as shown in FIG. 2, in embodiments in which the transducer subsystem 260 is structured to measure the position of the adjustable member 240 in terms of a distance d between the test point contacts 244, 254, the full range of distance d may be between, say, 0.010 inches to 0.200 inches. If it is known or empirically determined that the distance d must change by at least, say, 0.010 inches for the frequency response of the probe 220 to go out-of-spec, then a total of nineteen position ranges would be selected: a first range for distances d of 0.010-0.020 inches, a second range of 0.020-0.030 inches, and so on, up to a nineteenth range of 0.190-0.020 inches. Each range has one or more corresponding frequency response correction factors stored in the memory 270 that may be used to correct the actual frequency response of the probe 220 when the distance d is within that range. When the processor 280 detects that the position of the adjustable member 240 is within a particular range, the processor 280 reads the frequency response correction factors, or values corresponding to that particular range from the memory 270, and communicates the correction factors to the connected test and measurement instrument 210. The instrument 210 then applies the correction factors in software to correct the frequency response of the system 200.

Due to physical variations in the components of the probe 220, and inherent variability of the manufacturing process, the correction factors will be specific to each individual probe 220 that is manufactured. The correction factors are typically determined, and initially written to the memory 270, during a factory calibration process. In preferred embodiments, the memory 270 is a non-volatile memory, such as flash memory, allowing the correction factors to remain stored in memory even when the probe 220 is not powered. In general, a range of position values is written to the memory 270 together with one or more correction factors corresponding to that range. The range of position values may be stored in the memory 270 as a value of the position signal 264 that marks the upper or lower boundary of the range.

In some embodiments, the position signal 264 values may be normalized. That is, in some embodiments, due to the physical relationship between the adjustable member 240 and the transducer subsystem 260, the full range of motion of the adjustable member 240 will not produce the full range of possible output values of the position signal 264. This can also cause the position signal 264 to undesirably wrap around from low values to high values or vice-versa. To prevent this, the raw position signal 264 values may be normalized to full scale using the following equations:

$$\text{bias} = \text{full\_scale\_sensor\_value} - \text{max\_position\_signal\_value}; \text{ and} \quad (\text{EQ 1})$$

$$\text{normalized\_position\_signal\_value} = (\text{raw\_position\_signal\_value} + \text{bias}) \ \& \ \text{full\_scale\_sensor\_value}; \quad (\text{EQ 2})$$

where max_position_signal_value represents the value of the position signal 264 when the adjustable member 240 is at its maximum possible position in its range of motion.

Because there will typically be a few bits of noise in the position signal 264, if the position of the adjustable member 240 happens to be exactly on or very close to the boundary between two ranges, it is possible for the processor 280 to continuously detect a range change, and continuously try to switch back and forth between the correction factors corresponding to the two ranges. To avoid this undesirable behavior, in some embodiments, the processor 280 is configured to add hysteresis to the position signal 264.

Figure 5:
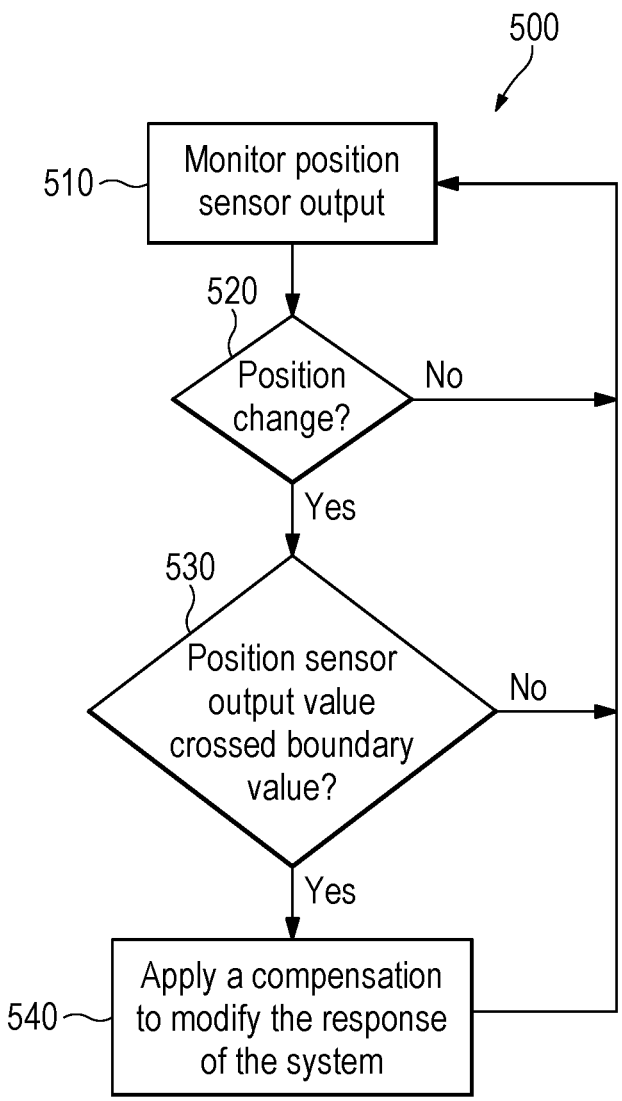
FIG. 5 is a flowchart of a method of compensating for a change in a frequency response of a test and measurement system, according to some embodiments of the invention.

FIG. 5 is a flowchart of a method 500 of compensating for a change in a response, such as a frequency response, of a test and measurement system, which system includes an instrument and a probe, according to embodiments of the invention. The probe has a part that is adjustable; that is, a first part of the probe that is capable of changing position relative to a second part of the probe. For example, the probe may have a test point contact that is capable of adjusting its position relative to the probe body, or, the probe may have a pair of test point contacts with an adjustable amount of space between the contacts. The method 500 includes monitoring a position sensor output 510 to detect a position change of a first part of the probe relative to a second part of the probe 520. The method 500 continues to monitor the position sensor output until a position change is detected. In some embodiments, the position change is detected by reading a first position sensor output value, reading a second position sensor output value, and then calculating a difference between the first position sensor output value and the second position sensor output value. If there is no difference between the first and second values, then no position change has occurred. If there is a difference, then the position change has occurred.

The method 500 includes determining that the position sensor output value has crossed a boundary value between a first range of position values and a second range of position values 530. In some embodiments, the boundary value to which the position sensor output value is compared has hysteresis applied. In cases where the position sensor output value happens to be right at the boundary value, adding hysteresis keeps step 530 from continuously determining that the position sensor output value has crossed the boundary value due to potential noise in the position sensor output. Accordingly, in some embodiments, step 530 includes determining the direction of the detected position change and comparing the position sensor output to a hysteresis boundary value that depends on the direction of the position change.

Figure 6A:
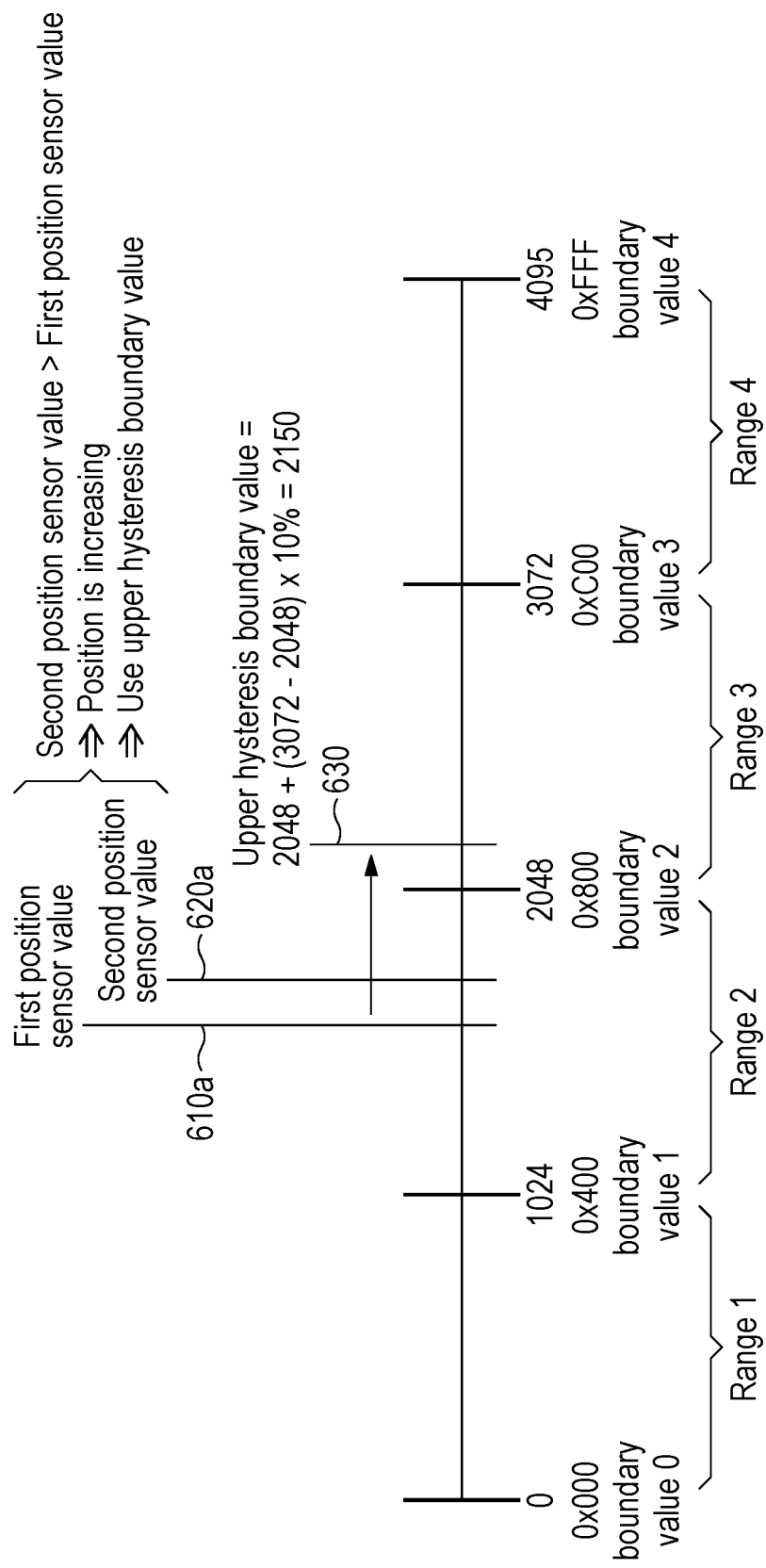
FIGS. 6A and 6B are diagrams illustrating applying hysteresis, according to some embodiments of the invention.
Figure 6B:
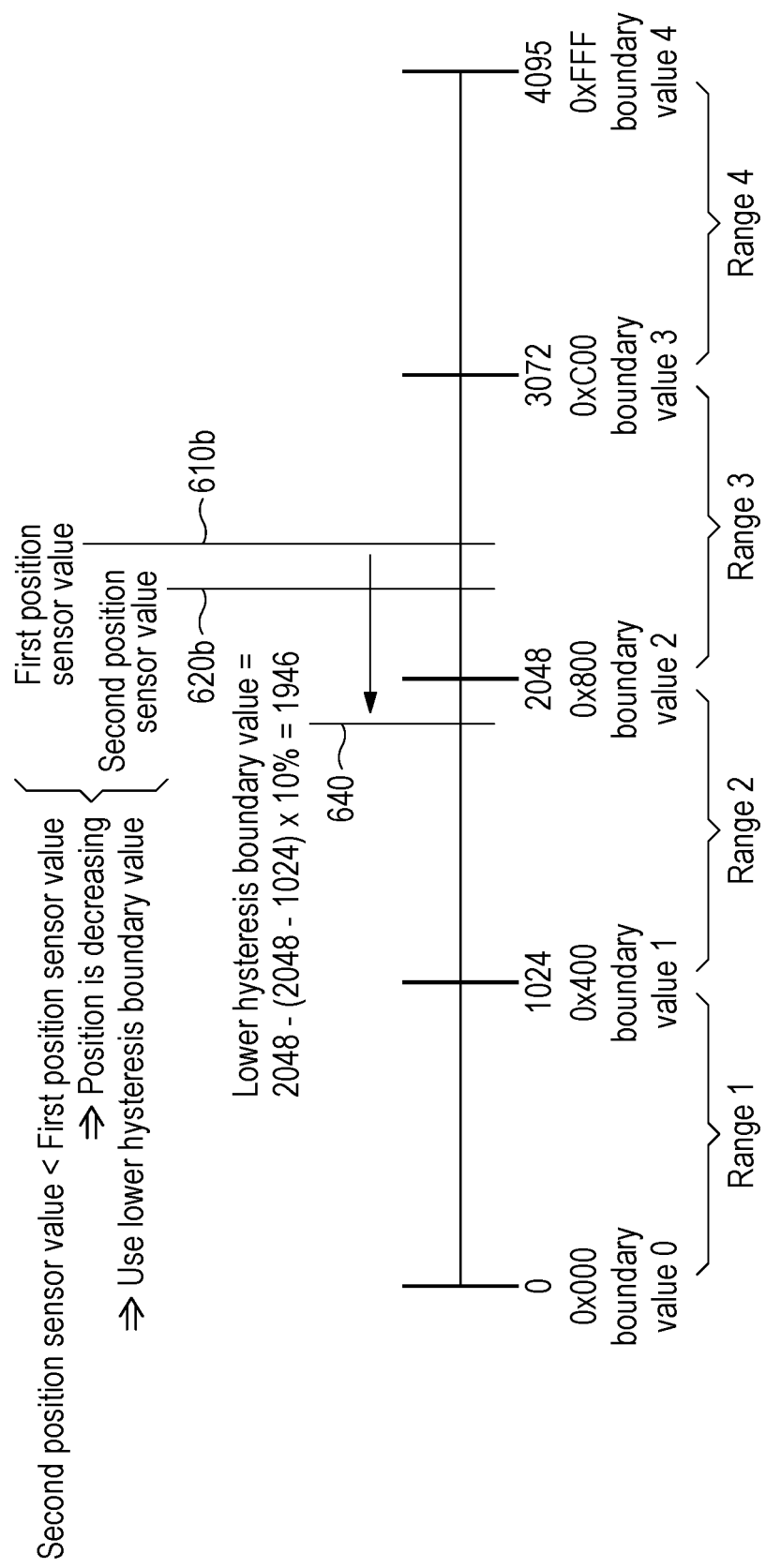

In other words, as illustrated in FIGS. 6A and 6B with example boundary values, if the adjustable part of the probe moves in one direction, then one hysteresis boundary value is used, but if the adjustable part of the probe moves in another direction, then a different hysteresis boundary value is used. For example, if the probe has a pair of test point contacts that change position to increase or decrease the amount of inter-contact spacing, when the amount of space is increasing, thereby producing increasing values of the position sensor output, an upper hysteresis boundary value 630 is used, and when the amount of space is decreasing, thereby producing decreasing values of the position sensor output, a lower hysteresis boundary value 640 is used.

Determining the direction of the position change may include reading a first position sensor output value 610a, 610b, reading a second position sensor output value 620a, 620b, calculating the difference between the two values, and determining whether the difference is positive or negative.

Static hysteresis boundary values may be calculated and used. However, in preferred embodiments, the hysteresis boundary value is calculated based on a percentage of the difference between two pre-determined boundary values. Calculating these dynamic hysteresis boundary values works better especially when there is non-linearity in the position sensor output. For example, the upper hysteresis boundary value 630 and the lower hysteresis boundary value 640 may be calculated using the following equations:

$$upper\_hysteresis\_boundary\_value = boundary\_value + \\ (((next\_higher\_boundary\_value - boundary\_value) * percent)/100); \text{ and} \quad (EQ\ 3)$$

$$lower\_hysteresis\_boundary\_value = boundary\_value - \\ (((boundary\_value - next\_lower\_boundary\_value) * percent)/100). \quad (EQ\ 4)$$

The upper and lower hysteresis boundary values 630, 640 may be pre-calculated and stored in a non-volatile memory in the probe.

Returning to FIG. 5, if step 530 does not detect that the position sensor output value has crossed a boundary value, or a hysteresis boundary value, as the case may be, then the method 500 returns to monitoring the position sensor output.

When step 530 does detect that a boundary value has been crossed, the method 500 also includes a step 540 of applying a compensation corresponding to the second range of position values to modify the response of the test and measurement system. Step 540 may be performed in hardware or in software.

In hardware, step 540 may include selecting a measured signal path in the probe that has electrical characteristics sufficient to compensate for the change in response caused by the adjustable first part of the probe being within the second range of positions. For example, the probe may have a plurality of selectable measured signal paths. If the adjustable part of the probe being within the second range of positions causes a particular frequency response change, one of the selectable signal paths may correspond to the second range of positions by having electrical characteristics that are sufficient to correct that particular frequency response change. For example, the signal path may include an analog filter that is designed to counteract that particular frequency response change. In this case, step 540 includes selecting the signal path that corresponds to the second range of positions.

In software, step 540 may include mathematically applying a compensation factor to modify a transfer characteristic of the system. For example, one or more frequency response compensation factors may be associated with each range of position sensor values. These frequency response compensation factors may be pre-determined to compensate for non-idealities in the probe's frequency response that result from the adjustable part of the probe being within a range of positions that produce the associated range of position sensor output values. When the position sensor output value crosses a boundary value into a new range, step 540 takes a factor associated with the new range and applies the factor to modify the frequency response of the test and measurement system.

In some embodiments, the frequency response compensation factors are stored in a non-volatile memory in the probe so that they can be applied in any system in which the probe is connected. However, the compensation factors could be stored in the instrument, on external media, or even in an online database. In some embodiments, step 540 includes reading a compensation factor from a non-volatile memory in the probe, communicating the compensation factor from the probe to the instrument, and modifying a transfer characteristic of the test and measurement system using the compensation factor. In preferred embodiments, modifying a transfer characteristic of the test and measurement system includes generating, in the instrument, a digital filter representing the response of the probe including the compensation factor, and incorporating the generated digital filter into the response of the system.

The compensation factors used in the method 500, for example, frequency response compensation factors, are unique to each probe, and are generally determined during a calibration process. The calibration process is typically performed at the factory during the manufacturing of the probe, but can also be performed in the field. Re-calibration generally needs to occur whenever adjustable parts of the probe that affect the signal path are changed.

Figure 7:
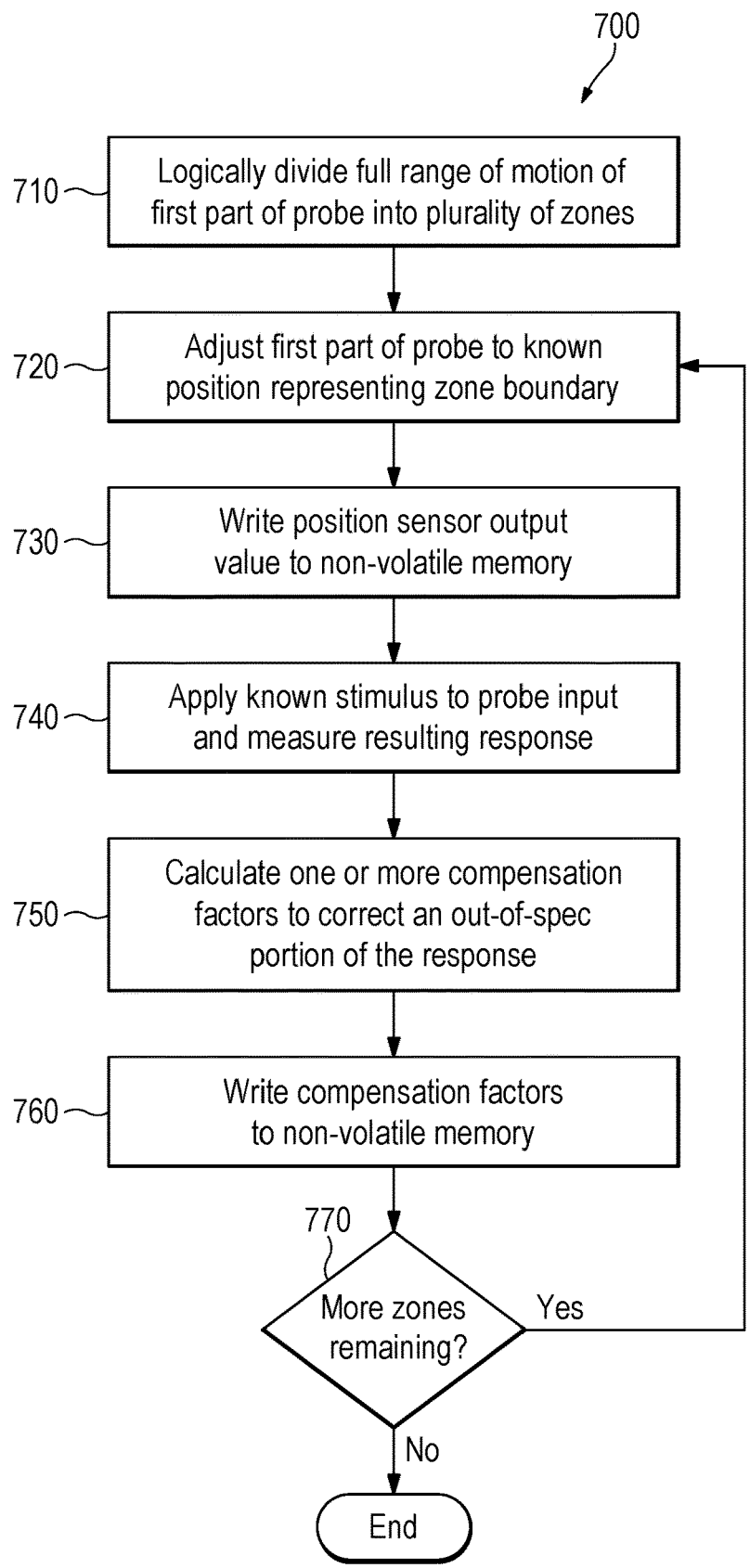
FIG. 7 is a flowchart of a method of calibrating a probe, according to some embodiments of the invention.

FIG. 7 illustrates such a calibration process 700 for a probe having a non-volatile memory, and having a position sensor that is structured to measure the position of an adjustable first part of the probe relative to a second part of the probe. The process 700 includes a step 710 of logically dividing the full range of motion of the first part of the probe into a plurality of zones. For example, for a probe in which the adjustable part comprises a pair of adjustable test point contacts, if the full range of motion of the test point contacts causes there to be a space between the contacts between 0.000 inches to 0.200 inches, the full range of motion can be evenly divided into four zones, each with a span of 0.050 inches. However, the zones do not need to be evenly divided. In some cases, non-linearity in the movement of the adjustable part of the probe may require, for example, more and smaller zones in the middle of the full range, and fewer and larger zones towards the ends of the full range. In preferred embodiments, the total number of zones, and the size of each zone, is selected so that movement of the adjustable part of the probe anywhere within a given zone has a negligible effect on the frequency response of the probe—that is, if the frequency response of the probe is within specification with the adjustable part in one position within a zone, the frequency response should remain "in-spec" for all other positions within the zone. The position-dependent nature of the frequency response of the probe is typically empirically determined.

The process 700 includes a step 720 of adjusting the position of the first part of the probe to a known position representing a boundary of one of the zones. That is, the process 700 generally starts with the adjustable first part of the probe being adjusted all the way to one end of its range of motion. The part is then adjusted the other direction to the first probe boundary. In some embodiments, the step 720 could be performed by setting the angle between the first part and the second part to a particular angle. In a preferred embodiment, in which the adjustable part of the probe comprises a pair of test point contacts with an adjustable inter-contact spacing, the step 720 includes setting the inter-contact spacing to a known distance using a spacing gauge.

The process 700 includes a step 730 of writing, to the non-volatile memory, the position sensor output value corresponding to the known position. In other words, the step 730 writes a position sensor boundary value to memory in the probe. This is a boundary value that may be used, for example, by the method 500 when the probe is in operation, as discussed above.

The process 700 includes a step 740 of applying a known stimulus signal to the probe input and measuring a resulting response of the probe, and a step 750 of calculating one or more compensation factors sufficient to correct a portion of the resulting response of the probe that does not meet a response specification of the probe. The measured response may be a step response or a frequency response. In some embodiments, the one or more compensation factors are in the form of network parameters, such as scattering parameters.

In the case of a frequency response, the known stimulus may be, for example, a sine wave of swept frequency from DC up to the probe's specified bandwidth. The resulting frequency response of the probe, with the first part of the probe set to the particular known position, is then analyzed to determine if there are any undesirable (i.e. out-of-spec) dips or peaks (i.e. non-idealities) in the frequency response. One or more compensation factors are then calculated that, when applied, would correct for the out-of-spec portion of the frequency response. For example, if the frequency response specification for the probe is +/−1.5 dB between 1-2 GHz, and the probe has a dip of −2 dB between 1.8-2 GHz, then one or more compensation factors are calculated that would be sufficient, when applied, to bring the frequency response between 1.8-2 GHz back to within the +/−1.5 dB spec.

The process 700 includes a step 760 of writing, to the non-volatile memory, the calculated one or more compensation factors corresponding to the one of the zones. These factors that are written to probe memory are the compensation factors that may be used, for example, by the method 500 when the probe is in operation, as discussed above.

The process 700 then repeats the steps 720-760 for each remaining zone in of the plurality of zones 770, thereby generating one or more compensation factors associated with each of the zones. When the probe is in operation, the appropriate one or more compensation factors will be applied to the frequency response of a system when it is detected that the adjustable part of the probe enters a particular zone.

Although specific embodiments of the invention have been illustrated and described for purposes of illustration, various modifications may be made without departing from the spirit and scope of the invention. Accordingly, the invention should not be limited except as by the appended claims.

What is claimed is:

1. A method of compensating for a change in a response of a test and measurement system, which system includes an instrument and a probe, the change in the response being caused by a movement of a first part of the probe, the method comprising:
monitoring a position sensor output to detect a position change of the first part of the probe relative to a second part of the probe;
determining that the position sensor output value has crossed a boundary value between a first range of position values and a second range of position values; and
applying a compensation corresponding to the second range of position values to modify the response of the test and measurement system.

2. The method according to claim 1 in which monitoring a position sensor output to detect a position change of the first part of the probe relative to a second part of the probe comprises:
reading a first position sensor output value;
reading a second position sensor output value; and
calculating a difference between the first position sensor output value and the second position sensor output value.

3. The method according to claim 1 in which determining that the position sensor output value has crossed a boundary value between a first range of values and a second range of values comprises:
determining the direction of the position change; and
comparing the position sensor output value to a hysteresis boundary value, the hysteresis boundary value depending on the direction of the position change.

4. The method according to claim 3 in which determining the direction of the position change comprises:
reading a first position sensor output value;
reading a second position sensor output value; and
determining whether the second value is greater than the first value.

5. The method according to claim 3 in which the hysteresis boundary value is calculated based on a percentage of the difference between two boundary values.

6. The method according to claim 1 in which applying a compensation corresponding to the second range of position values to modify the response of the test and measurement system comprises selecting, in the probe, a measured signal path having electrical characteristics sufficient to compensate for the change in response.

7. The method according to claim 1 in which applying a compensation corresponding to the second range of position values to modify the response of the test and measurement system comprises:
reading a compensation factor from a non-volatile memory in the probe;
communicating the compensation factor from the probe to the instrument; and
modifying a transfer characteristic of the test and measurement system using the compensation factor.

8. The method according to claim 7 in which modifying a transfer characteristic of the test and measurement system using the compensation factor comprises:
generating, in the instrument, a digital filter representing the response of the probe including the compensation factor; and
incorporating the generated digital filter into the response of the system.

* * * * *